United States Patent [19]

McElroy

[11] Patent Number: 4,503,524
[45] Date of Patent: * Mar. 5, 1985

[54] ELECTRICALLY ERASABLE DUAL-INJECTOR FLOATING GATE PROGRAMMABLE MEMORY DEVICE

[75] Inventor: David J. McElroy, Houston, Tex.

[73] Assignee: Texas Instruments Incorporated, Dallas, Tex.

[*] Notice: The portion of the term of this patent subsequent to May 17, 2000 has been disclaimed.

[21] Appl. No.: 367,838

[22] Filed: Apr. 13, 1982

Related U.S. Application Data

[60] Continuation-in-part of Ser. No. 155,039, Jun. 2, 1980, Pat. No. 4,384,349, which is a continuation-in-part of Ser. No. 80,712, Oct. 1, 1979, Pat. No. 4,282,446, and Ser. No. 110,052, Jan. 7, 1980, Pat. No. 4,373,248, said Ser. No. 110,052, is a continuation-in-part of Ser. No. 923,876, Jul. 12, 1978, Pat. No. 4,184,007, which is a division of Ser. No. 762,613, Jan. 26, 1977, Pat. No. 4,151,021.

[51] Int. Cl.$^3$ .............................................. G11C 13/00
[52] U.S. Cl. ...................................... 365/218; 365/189
[58] Field of Search ......................... 365/218, 189, 230

[56] References Cited

U.S. PATENT DOCUMENTS

| | | | |
|---|---|---|---|
| 3,875,567 | 4/1975 | Yamazaki et al. | 365/218 |
| 4,308,596 | 12/1981 | Takai et al. | 365/218 |
| 4,384,349 | 5/1983 | McElroy | 365/218 |

Primary Examiner—Terrell W. Fears
Attorney, Agent, or Firm—John G. Graham

[57] ABSTRACT

An improved electrically erasable semiconductor memory device of the N-channel, MOS, double level poly, programmable, read only memory or EPROM type is provided. The device is an array of cells electrically erased and programmed by dual injection into floating gates which are interposed between the channels and control gates. The electrical erasure or programming of the cells is accomplished by applying selected voltages to the source, drain, control gate and substrate to produce injection of electrons or holes.

22 Claims, 12 Drawing Figures

|  |  | VOLTAGE ON: | | | |
|---|---|---|---|---|---|
|  |  | DRAIN 18 (LINE 23) | GATE 19 (LINE 20) | GATE 14 (PIN 15'; LINE 15) | SOURCE 11 (LINE 28) |
| READ | ROW SELECTED, COLUMN SELECTED | SENSED | +5 v. | +5 v. | 0 v. |
| | ROW SELECTED, COLUMN NOT SELECTED | — | +5 v. | +5 v. | 0 v. |
| | ROW NOT SELECTED, COLUMN NOT SELECTED | — | 0 v. | +5 v. | 0 v. |
| | ROW NOT SELECTED, COLUMN SELECTED | — | 0 v. | +5 v. | 0 v. |
| PROGRAM | ROW SELECTED, COLUMN SELECTED | 0 v. | +25 v. | +25 v. | +15 v. |
| | ROW SELECTED, COLUMN NOT SELECTED | FLOAT | +25 v. | +25 v. | +15 v. |
| | ROW NOT SELECTED, COLUMN NOT SELECTED | FLOAT | 0 v. | +25 v. | +15 v. |
| | ROW NOT SELECTED, COLUMN SELECTED | 0 v. | 0 v. | +25 v. | +15 v. |
| ERASE | ROW SELECTED, COLUMN SELECTED | +20 v. | +25 v. | -30 v. | FLOAT |
| | ROW SELECTED, COLUMN NOT SELECTED | 0 v. | +25 v. | -30 v. | FLOAT |
| | ROW NOT SELECTED, COLUMN NOT SELECTED | 0 v. | 0 v. | -30 v. | FLOAT |
| | ROW NOT SELECTED, COLUMN SELECTED | +20 v. | 0 v. | -30 v. | FLOAT |

*Fig. 4*

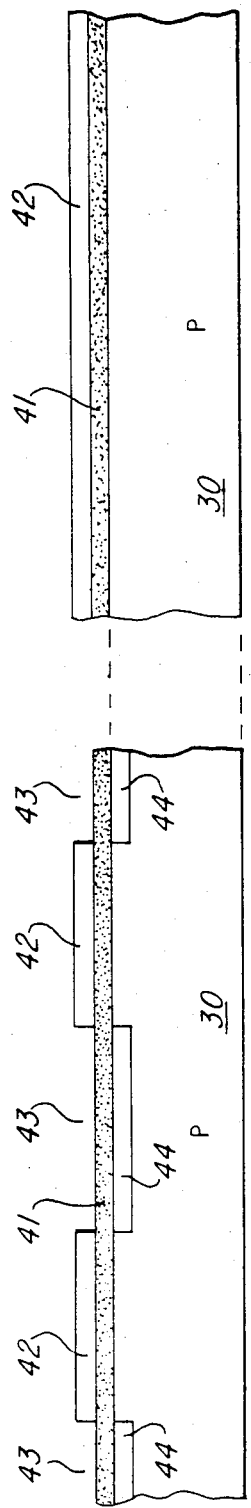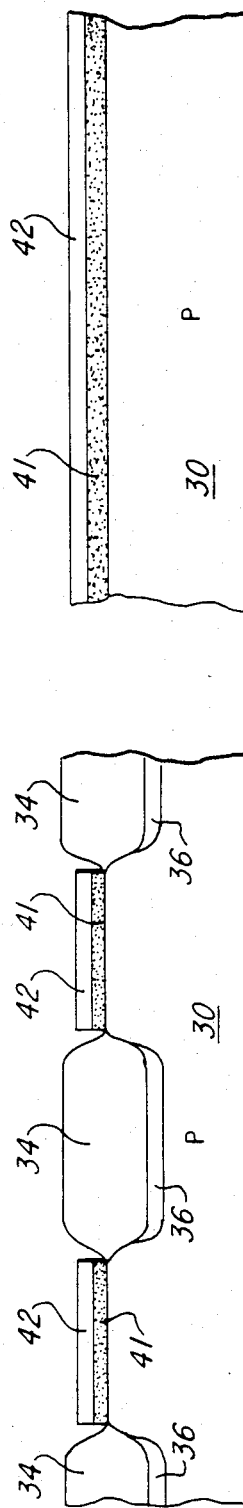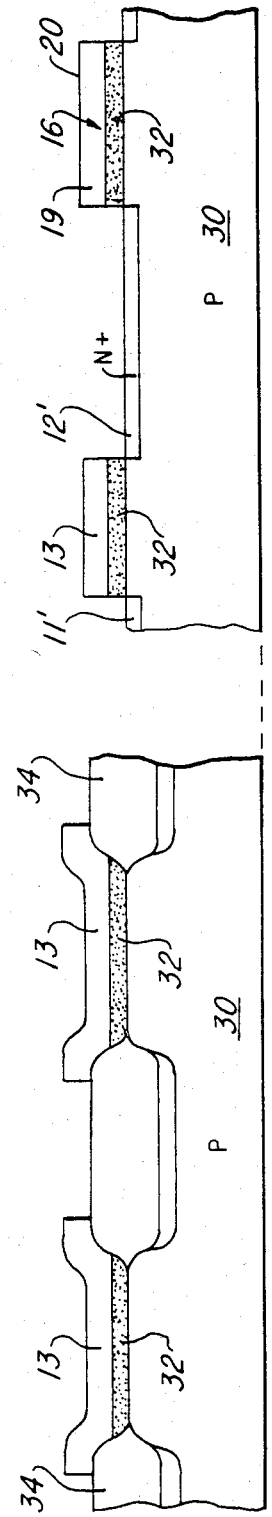

ELECTRICALLY ERASABLE DUAL-INJECTOR FLOATING GATE PROGRAMMABLE MEMORY DEVICE

Belated Cases

This application is in part a continuation of my prior copending application Ser. No. 155,039, filed June 2, 1980, (now U.S. Pat. No. 4,384,349); said application Ser. No. 155,039 being a continuation-in-part of Serial No. 80,712, filed October 1, 1979, (now U.S. Pat. No. 4,282,446), and a continuation-in-part of Serial No. 110,052 filed January 7, 1980 (now U.S. Pat. No. 4,373,248); said application Serial No. 110,052 being a continuation-in-part of Serial No. 923,876, filed July 12, 1978 (now U.S. Pat. No. 4,184,207) which was a division of application Serial No. 762,613, filed January 26, 1977 (now U.S. Pat. No. 4,151,021) assigned to Texas Instruments.

BACKGROUND OF THE INVENTION

This invention relates to semiconductor memory devices and more particularly to a read-only-memory or ROM which is electrically programmable and electrically erasable.

Electrically programmable memory devices of the type shown in U.S. Pat. No. 3,984,822 employs a floating gate in a double level polysilicon MOS ROM structure; for programming, the floating gate is charged by injection of electrons from the channel. Generally, this floating gate EPROM device is erased by exposure to ultraviolet light, requiring an expensive package with a quartz window. Electrically erasable devices of the MNOS type have employed charge storage on a nitride-oxide interface. Electrically alterable ROM's have been developed as set forth in U.S. Pat. Nos. 3,881,180, issued Apr. 19, 1975, and 3,882,469, issued May 6, 1975, and 4,037,242, issued July 19, 1977, all by W. M. Gosney, and my U.S. Pat. No. 4,384,349. Ser. No. 644,982, filed Dec. 29, 1975, all by W. M. Gosney, and my prior application Ser. No. 155,039, filed June 2, 1980, all assigned to Texas Instruments; these devices are floating gate cells with dual injection (both holes and electrons) so that the gates may be charged or discharged by applying suitable voltages. Other electrically alterable EPROM's are disclosed in U.S. Pat. Nos. 4,122,509 and 4,122,544 by Lawrence S. Wall or David J. McElroy, assigned to Texas Instruments. However, the prior cells have exhibited some undesirable characteristics such as large cell size, complex structure, process instability, process incompatible with standard techniques, high voltages needed for programming or erasure, or the like.

It is therefore the principal object of the invention to provide improved electrically erasable semiconductor devices, e.g., electrically alterable, programmable read-only-memory cells. Another object is to provide an electrically erasable memory cell which may be readily formed in a semiconductor integrated circuit, particularly a dual injection type cell. A further object is to provide arrays of electrically erasable memory cells generally compatible with N-channel floating gate EPROM technology.

SUMMARY OF THE INVENTION

In accordance with one embodiment of the invention, an improved electrically erasable semiconductor memory device of the N-channel, MOS, double level poly, programmable, read only memory or EPROM type is provided. The device is an array of cells electrically erased and programmed by dual injection into floating gates which are interposed between the channels and control gates. The electrical erasure or programming of the cells is accomplished by applying selected voltages to the source, drain, control gate and substrate to produce injection of electrons or holes.

BRIEF DESCRIPTION OF THE DRAWINGS

The novel features believed characteristic of the invention are set forth in the appended claims. The invention itself, however, as well as other features and advantages thereof, may best be understood by reference to the following detailed description of illustrative embodiments, when read in conjunction with the accompanying drawings, wherein:

FIG. 4 is a table of the voltages on various nodes of, the device of FIGS. 1-3 for read, program and erase conditions; and FIG. 5a-5e are sectional views corresponding to FIG. 3a showing a cell according to one embodiment of the invention at various stages of manufacture.

DETAILED DESCRIPTION OF SPECIFIC EMBODIMENT

Figure 1:
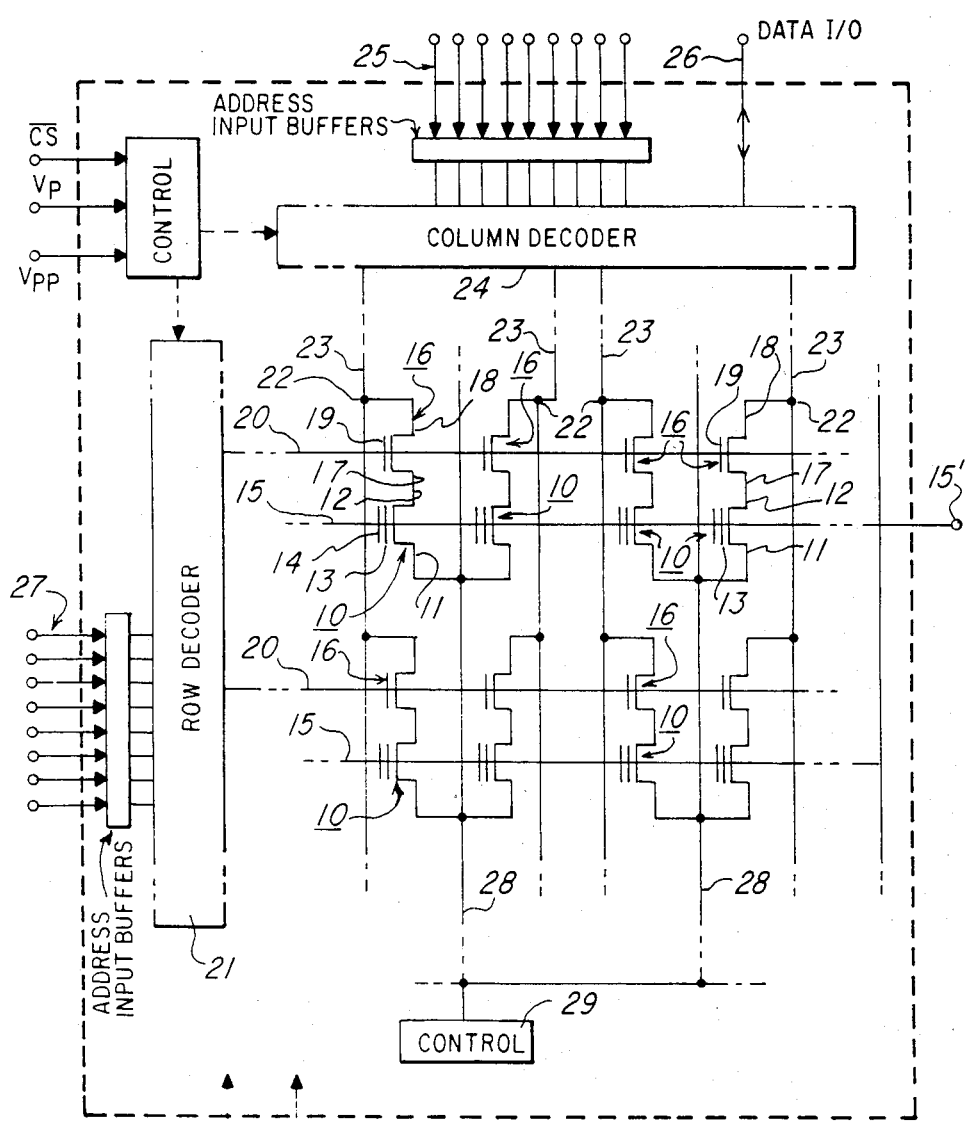
FIG. 1 is an electrical schematic diagram of an array of electrically-erasable, dual injection, floating gate memory cells according to one embodiment of the invention.

Referring now to FIG. 1, an array of electrically erasable memory cells is shown in schematic diagram according to one embodiment of the invention. The array is shown in layout form as part of a semiconductor integrated circuit in FIG. 2, and FIGS. 3a-3d are sectional views of FIG. 2. Each cell has a floating gate transistor 10 with a source 11, a drain 12, a floating gate 13 and a control gate 14. All of the control gates 14 in a row of cells are connected to a row line 15, and all of the row lines 15 are connected together and taken off chip at a pin 15' without being connected to any N+ region in the substrate. In series with each transistor 10 is an access transistor 16 which has a source 17, a drain 18, and a gate 19. The gates 19 are connected to row lines 20, and all these row lines are connected to a row address decoder 21. All of the drain electrodes 18 in a column of cells are connected at contacts 22 to a column line 23, and the column lines 23 are connected at one end to a column decoder 24. The column decoder functions to apply either a supply voltage Vcc (+5 v) for read operations, a programming voltage $V_p$ (about +20 v), a low voltage (zero) or a floating condition, selectively to each column line 23, in response to read, program or erase commands and a column address on pins 25, as well as to a "0" or "1" data input on a pin 26. The row decoder 21 functions to apply a read voltage Vcc (+5 v), a program voltage Vpp (+25 v), or a low voltage Vss to each of the row lines 20 in response to a row address on pins 27 and to read, program or erase commands. All of the sources 11 are connected to a ground line 28 which is common to all cells in the array.

The line 28 is connected by a control circuit 29 to Vss for read, to +15 v for program operations, or to float condition for erase.

For read, the device is operated as a standard ROM; the column line 28 for the selected cell is grounded, and the column decoder 24 in effect connects the selected column line 23 to the output pin 26, using a standard decode arrangement, sense amplifier and output buffer. The row decoder 21 applies a logic "1" or Vcc voltage to the selected row line 20 and applies a logic "0" or Vss to all other row lines 20. By the pin 15', Vcc is applied to all of the row lines 15 in the entire array. The output on pin 26 will thus depend upon whether the floating gate 13 of the selected cell transistor 10 is charged or not.

Figure 3A:
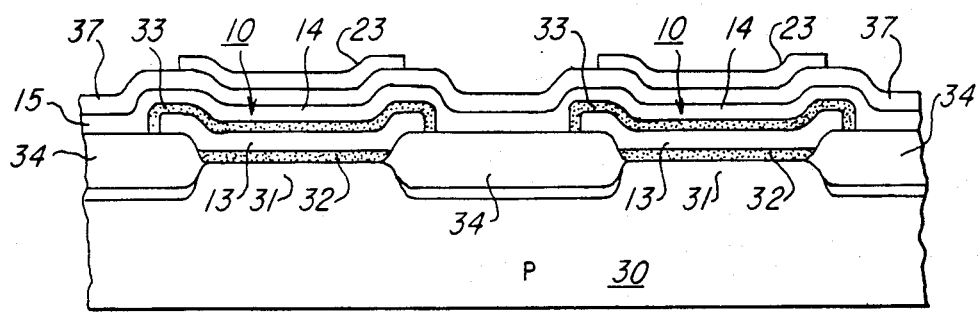
FIGS. 3a-3d are elevation views in section of the array of FIG. 2, taken along the lines a-a, b-b, c-c, and d-d respectively, in FIG. 2.
Figure 3B:
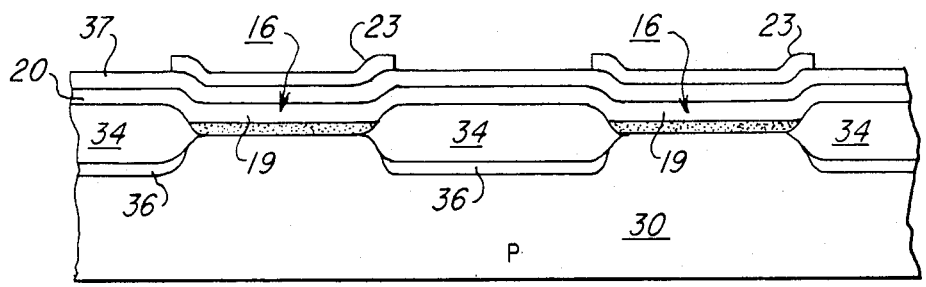

The structure of one of the cells is seen in a greatly enlarged sectional view in FIG 3a. The cell is formed in a semiconductor substrate 30 which is P-type silicon for the N-channel floating gate MOS EPROM transistors herein described. The transistor 10 of the cell includes a channel region 31 between N+ type source and drain regions 11 and 12, seen in FIG. 3c. The channel region 31 lies beneath the floating gate 13 which is composed of phosphorus-doped polycrystalline silicon. The floating gate 13 is insulated from the underlying channel region 31 by a gate oxide layer 32 composed of thermally-grown silicon oxide of a thickness of perhaps 500 A. The control gate 14 is also composed of phosphorus-doped polycrystalline silicon extending over the floating gate 13 and functioning as the row line 15. The control gate 14 is isolated from the floating gate by a thermal oxide layer 33 of at least about 1000 A thickness. The transistor 16 is of the same structure but without a floating gate; the gate 19 is of first level polysilicon.

Figure 3C:
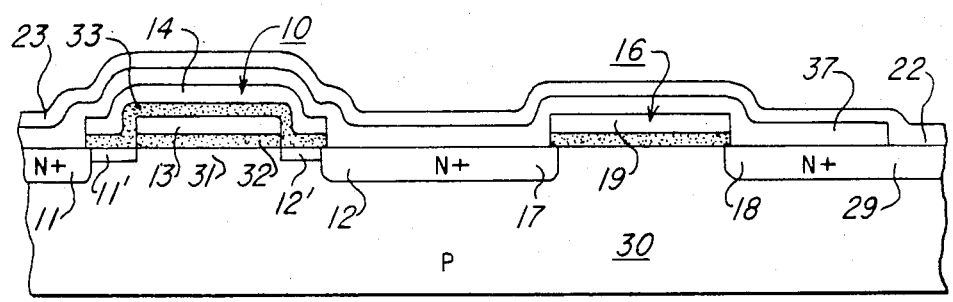
Figure 3D:
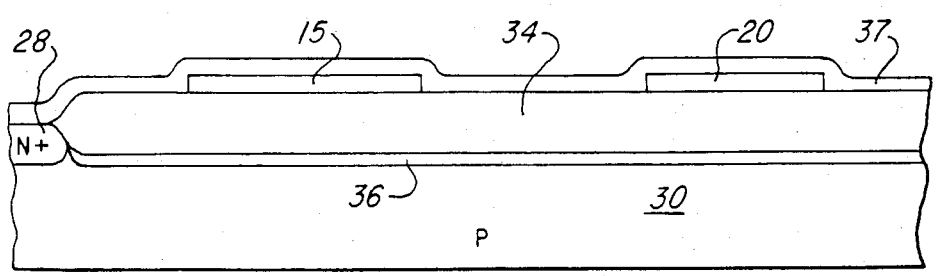

Referring to the Table of FIG. 4, the cell of FIG. 3a and 3c is programmed by holding the source 11 at a programming voltage Vp of about +15 v., and the selected drain 18 at Vss, while control gate 14 and the selected gate 19 are a higher programming voltage Vpp, about +25, whereupon the level of current through the channel 31 is such that hot electrons are injected through the oxide 32 and charge the floating gate 13. Once charged, the floating gate stays in this condition indefinitely; the apparent threshold voltage of the transistor is greatly increased, from perhaps +0.8 to about +6 volts. Note that the cell is programmed in the reverse direction from read operations, i.e., the source and drain are switched, in effect. To program only one cell in the array of FIG. 1, the other lines 23 to the left and right of the selected column line 23 are all held in a floating condition so that only one cell in the selected row is subjected to programming conditions because only one cell can conduct current in the channel 31, even though all cells have +15 on the source 11 and all in the selected row have +25 on the gates 14 and 19.

Again referring to FIG. 4, to erase a selected cell 10, according to the invention, the selected row line 20 is held at +25 and all other row lines 20 are held at Vss by the row decoder circuitry 21. The ground lines 28 and sources 11 for the entire array are placed in a float condition by circuit 29. The selected column line 23 is held at +20 v and all other column lines 23 at Vss by the column decoder 24. All of the lines 15 for the entire array are held at −30 v by the pin 15' going off chip. This high negative voltage, −30 v, on the control gate 14 of the selected cell functions to shift the field plate BVDSS (breakdown voltage, drain to source or substrate) to a higher value; for this cell the drain 12 is coupled to the +20 v on the column line 23 because the gate 19 has +25 v on it, all other cells either have zero on the gate 19 or line 23. Thus, this selected cell 10 can exhibit avalanche breakdown at the drain-to-channel junction at a lower voltage than all the non-selected cells. This condition causes the drain-to-channel PN junction of the selected transistor 10 to reach avalanche breakdown and inject holes which are attracted toward the highly negative (−30 v) control gate 14 as well as attracted toward the negatively charged floating gate 13 if the cell has been programmed. The holes will discharge the floating gate by recombining with electrons. As the floating gate discharges, the negative field decreases, the fewer holes traverse the gate oxide 32, so over-erasure is minimal. The cells in the selected column but non-selected rows will not be in an inadvertent program condition, even though they have high negative voltage on control gate 14, because the source will be floating and the drain 12 is not coupled to a high voltage (+20); thus, current cannot be high enough for electron injection. Avalanche current to the substrate injects holes.

FIG. 4 shows the voltage on the column line 23, the row lines 20, the row lines 15 and the ground lines 28, selected and non-selected, for read, program and erase conditions. The exact voltages are of course subject to modification depending upon the process used, geometries, and the like. The ratios of voltages are important, however. The voltage on the gates 19 (row lines 20) must be enough greater than on the column line 23 so that the drop across the transistor 16 is zero during the erase condition for the selected cell. The voltages on the gates 14 and 19 (lines 15 and 20) must be much higher than the drop between source 11 and drain 18 (ground line 28 and column line 23) so that very high current will flow through the selected cell to assure efficient programming by electron injection.

Figure 2:
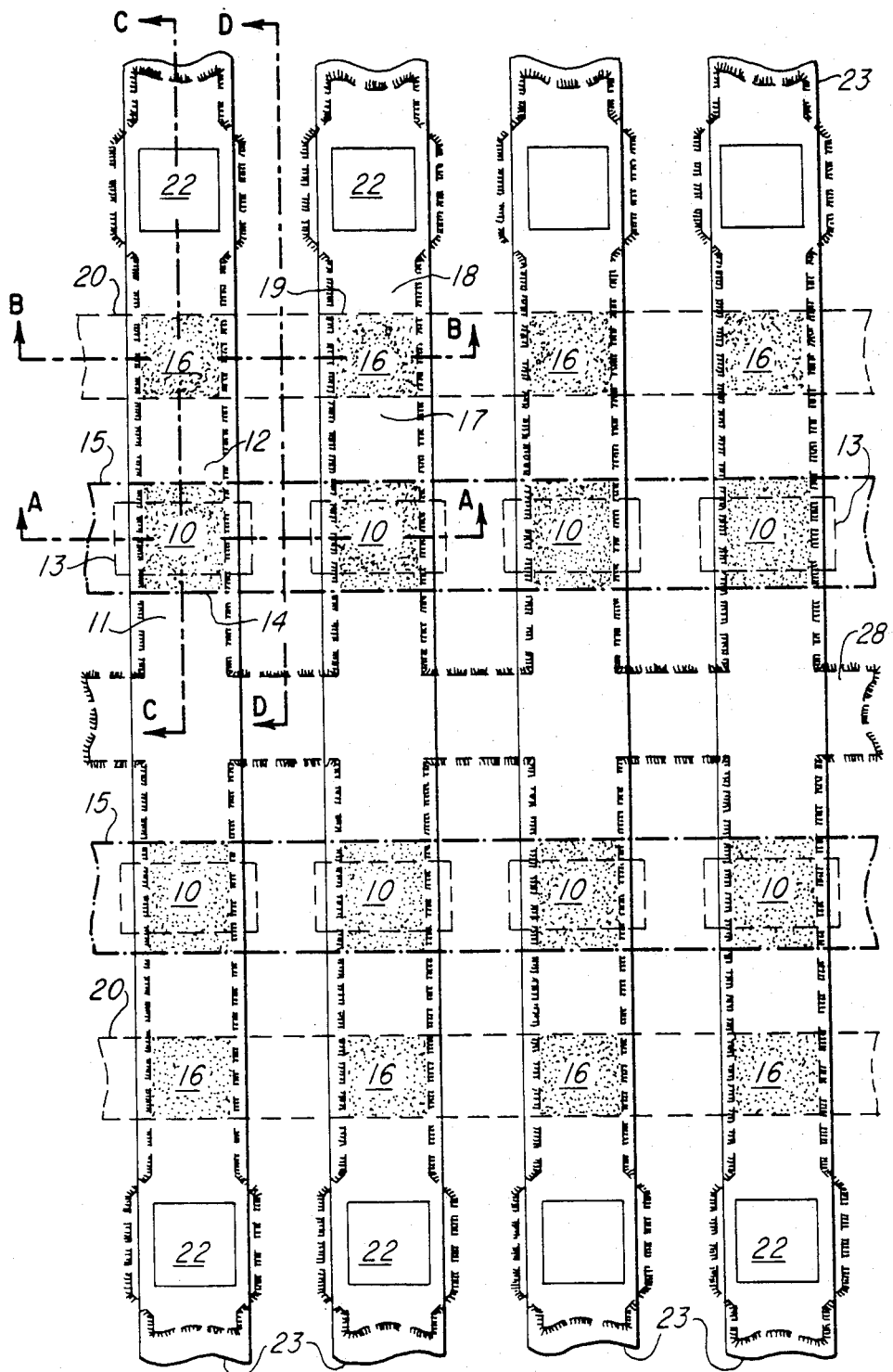
FIG. 2 is a plan view of a part of a semiconductor integrated circuit chip containing the array of cells of FIG. 1.

In FIG. 2, a part of the cell array of FIG. 1 is illustrated in plan view, and FIGS. 3a to 3d, sectional views of the device of FIG. 2, show details of construction. The area shown in FIG. 2 is less than one mil square in size; the entire cell array may contain, for example, 65,536 cells ($2^{16}$) so there would be 256 row lines 20 and 256 column lines 23. Of course, usually the array would be partitioned to provide an 8-bit output rather than one bit. The transistors 10 for the cells shown are created in parallel elongated columns with thick field oxide 34 surrounding the cells. N+ diffused regions 35 form interconnections for the ground lines 28, and of course N+ regions 29 create the areas for connects 22 to column lines 23. Elongated parallel strips of polycrystalline silicon form the address lines 15 and the control gates 14 of the transistors. The floating gates 13 are buried beneath the strips 15. Another set of elongated parallel strips of polycrystalline silicon forms the row lines 20.

Turning now to FIGS. 5a–5e, a process for manufacturing the devices of FIGS. 1–3 will be explained. Note that the left part of FIGS. 5a–5e correspond to half of the sectional view of FIG. 3a in the finished device, that is to line a-a in FIG. 2, while the right side of FIGS. 5a–5e correspond to the sectional view of FIG. 3c, that is to the line c-c in FIG. 2. this is generally an N-channel, silicon-gate, self-aligned, double-level-poly process for making MOS integrated circuit devices. The starting material is a slice of P-type monocrystaline silicone thermally oxidized to produce an oxide layer 41 of a thickness of about 1000 Å and a layer 42 of silicon nitride of about 1000 Å, is formed over the oxide. A coating of photoresist is applied to the entire top surface, then exposed to ultra-violet light through a mask which defines the desired pattern, and developed. This leaves areas 43 where nitride is to be etched away; these are the areas where the field oxide 34 is to be grown. The slice is subjected to a plasma etch, which removes the part of the nitride layer 42 not covered by the photoresist, but does not remove the oxide layer 41 and does not react with the photoresist. The slice is next subjected to a boron implant into the areas 43 not covered by photoresist which masks the implant. More heavily doped P+ regions 44 are thus produced in the surface to ultimately become the channel stop regions 36. The photoresist is then removed.

As set forth in U.S. Pat. No. 4,055,444 issued to G. R. Mohan Rao, assigned to Texas Instruments, the slice is next subjected to a heat treatment at about 1000° C. for perhaps about two hours in an inert atmosphere such as nitrogen, causing the P+ regions 44 to penetrate deeper into the silicon surface and curing implant damage.

The next step is formation of field oxide 34, which is done by subjecting the slices to steam or an oxidizing atmosphere at about 900° C. for perhaps 10 hours. The nitride layer 42 masks oxidation beneath it. As seen in FIG. 5b, this causes a thick field oxide layer 34 to be grown, and this region extends into the silicon surface because silicon is consumed as it oxidizes. The thickness of this layer 34 is about 10,000 Å, part of which is above the original silicon surface and part below. The boron doped P+ regions 44 as previously implanted and modified by the $N_2$ anneal step will be partly consumed, but will also diffuse further into the silicon ahead of the oxidation front, producing the P+ channel stop regions 36.

The nitride layer 42 and its underlying oxide layer 41 are now removed by etching and another thin silicon oxide layer 32 of about 400 Å is grown over the exposed areas of silicon, producing the gate insulator.

A layer of polycrystalline silicon of about one-half to one micron thickness is deposited over the entire slice in a reactor using standard techniques, producing the polysilicon which will utltimately form the floating gates 13 and the row lines 20; this layer of poly is subjected to a phosphorus deposition and diffusion to render it highly conductive.

Referring to FIGS. 5c, the polysilicon layer and the underlying gate oxide 32 are next patterned by applying a layer of photoresist, exposing to ultraviolet light through a mask, developing the photoresist image, and then etching, with the remaining photoresist masking certain areas of the polysilicon. The remaining part of the polysilicon layer provides what will be the floating gates 13 and row lines 20.

The slice is next subjected to a blanket arsenic implant at about $10^{13}$ to $10^{14}$ per $cm^2$ which will create implanted N regions 11' and 12'. A boron implant at about $5 \times 10^{12}$ to $5 \times 10^{14}$ per $cm^2$ may be performed to create P-type regions adjacent the N− regions 11' and 12' in the channel, producing the programming efficiency improvements of a P+ tank; alternatively, a P+ tank may be used. Other photoresist mask steps may cover areas where these implants are not wanted. The arsenic is aligned with the first level poly gate 13 and underlying gate oxide 32.

Figure 5D:
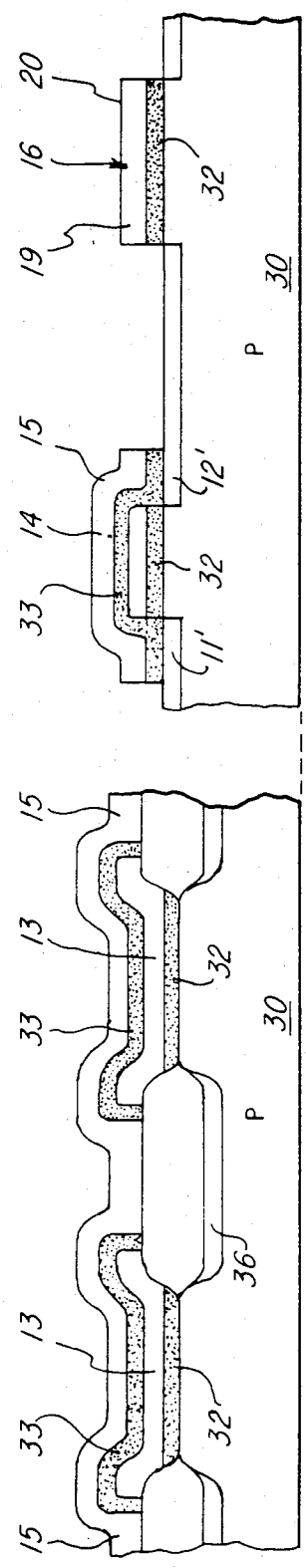
Figure 5E:
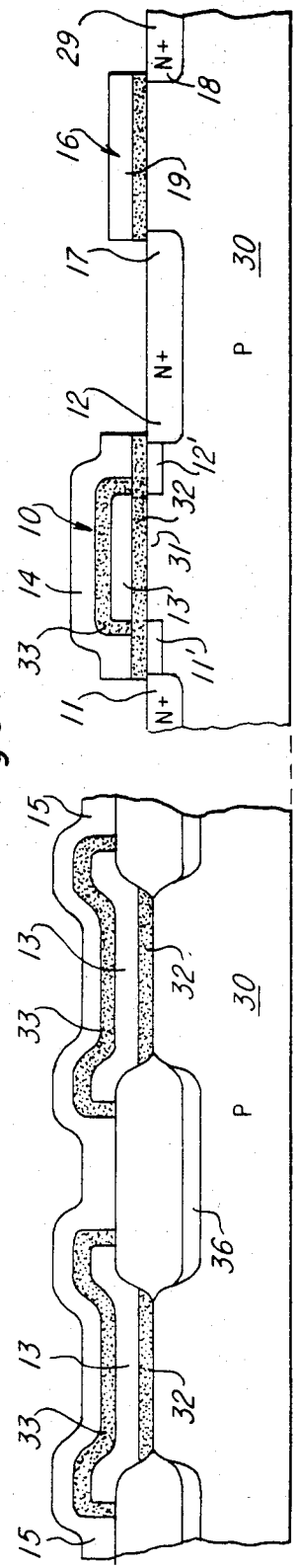

The layer 33 of silicon dioxide is next grown on the first level polysilicon, producing a coating on all exposed surfaces of the poly, as seen in FIG. 5d, including tops and sides. The second level polysilicon is next deposited over the entire top surface of the slice, covering the oxide layer 33. The second layer poly is patterned using photoresist to define the control gates 14 and the row lines, then if necessary the oxide layer 33 is etched away in all areas except under the strips 15. A deposition and diffusion operation (or As implant) into the moats produces the heavily doped N+ source and drain regions 11, 12, 17, 18 as well as the N+ regions 28 and the regions 29 under the contact areas 22 as seen in FIG. 5e. The N+ diffused moat regions function as conductors which connect the various regions together, and also function as the source or drain regions. This diffusion also heavily dopes all the exposed polysilicon areas such as the control gates 14 and lines 15.

As seen in FIG. 3, fabrication of the device is continued by depositing a layer of phosphorus-doped oxide 37 by a low temperature reaction process, and patterning to open contact holes. Then a layer of aluminum is deposited on the entire slice and patterned using photoresist masking to provide the metal lines 23, and various peripheral interconnections. A protective overcoat is deposited and patterned to expose bonding pads, the slice is scribed and broken into individual bars, and the bars packaged in the customary manner.

An important feature of the embodiment disclosed in the foregoing is that the large negative voltage used for erase is present only on the lines 15 and pin 15' going off-chip without necessity for connection to any N+ source/drain region, so no PN junction will be forward biased. However, in a CMOS device where N-type tanks are formed, the negative voltage may be generated on-chip using P channel transistors in the N-type tanks without forward biasing the source/drain junctions.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A method of electrically erasing a selected memory cell in an array of rows and columns of memory cells of the type having a source-drain path, a charge level and a control gate, comprising the steps of: applying a high voltage to one end of the source-drain path of said selected cell while applying a float condition to the other ends of the source-drain paths of all cells in the array; and applying a high voltage of opposite polarity to said control gate of the selected cell and to said control gates of all non-selected cells in the array, to thereby produce avalanche breakdown in the selected cell and erasure at said charge-storage level by hole injection.

2. A method according to claim 1, wherein said charge-storage level is a floating gate which is charged by electrons injected through a dielectric layer between said source-drain path and the floating gate and erased by holes injected through said dielectric layer.

3. A method according to claim 1 wherein the step of applying said high voltage of opposite polarity is done without connnecting such voltage to a semiconductor substrate on which said cells are formed.

4. A method according to claim 1, wherein said high voltage is greater than a programming voltage level for said cells.

5. A method according to claim 4 wherein said high voltage produces avalanche breakdown at said one end of the source-drain path, and said programming level voltage produces electron injection.

6. A method according to claim 5, wherein a high voltage of the same polarity is applied to said control gate of all cells for programming.

7. A method of erasing a selected floating gate field effect transistor in an array of rows and columns of such transistors comprising:
applying a high voltage to a selected row containing said selected transistor and to all other rows whereby the control gates of said selected transistor and all other control gates are at a high voltage to allow an avalanche breakdown condition;
applying a high voltage to one end of the source-drain path of the transistor in a selected row and not to rows other than said selected row to thereby allow the avalanche breakdown of a selected transistor.

8. A method according to claim 7, wherein the other ends of said source-drain paths for the selected cell and cells other than said cell are floating.

9. A method according to claim 7, wherein high voltage is applied to said one end of the source-drain path of the selected cell via an access transistor having a high voltage on its gate.

10. A method according to claim 7, wherein said avalanche breakdown causes hole injection to discharge said floating gate.

11. A method according to claim 10, wherein said high voltage is positive and much greater than a threshold voltage which causes conduction in the source-drain path.

12. An electrically eraseable floating gate type memory array formed in a semiconductor substrate comprising: a plurality of first field-effect transistor devices each having a source, a drain, a floating gate, and a control gate, the floating gate being isolated from the channel between source and drain by thin insulator and the control gate being isolated from the floating gate by thin insulator; a plurality of second field-effect transistors devices each having a source, a drain and a gate, the gate being isolated from the channel between source and drain thin insulator; a memory cell being defined by one of the first transistors connected in series with one of the second transistors, the cells being arranged in an array of rows and columns, the drains of the second transistors being connected to elongated parallel column lines; means connecting the control gates of all of the first transistors in all rows together and to a terminal without connection to said substrate, means connecting the gates of all of the second transistors in a row together to provide row lines; means for applying high voltage of one polarity to a selected one of the column lines and a selected one of the row lines; means for applying a high voltage of opposite polarity to all of said control gates via said terminal; and means for applying a low voltage to row lines other than said selected row line.

13. A memory array according to claim 12, wherein said high voltages produce avalanche breakdown in the first transistor in the cell of said selected row and selected column but in no other transistor in said array.

14. A memory array according to claim 13, wherein the avalanche breakdown of said first transistor causes erasure by holes injected into said floating gate.

15. A memory array according to claim 14, wherein the transistor devices are N-channel and the floating gates and control gates are separate layers of polycrystalline silicon.

16. A memory array according to claim 14, wherein said column lines other than said selected one are at low voltage and said sources of the first transistors are electrically floating.

17. An electrically erasable, electrically programmable semiconductor memory device comprising: an array of rows and columns of memory cells, each cell having first and second transistors; the first transistor having a control gate connected by a common line to control gates of all cells in a row; each of said first transistors having a source-drain path connected at one end to a common node, the second transistor in each cell having a source-to-drain path connecting the other end to a column line; the first transistor having a floating gate between said source-drain path and said control gate in each cell; the gate of the second transistor of each cell in a row being connected to a row line; means for connecting a selected one of the row lines and a selected one of the column lines to high voltage for erasure while maintaining the control gates of all cells in the array at a high voltage of opposite polarity causing avalanche breakdown; and means for connecting non-selected ones of said row lines to a low voltage.

18. A device according to claim 17, wherein said high voltages are much higher than the threshold voltage which turns on the source-drain paths of the first and second transistor in a normal read operation.

19. A device according to claim 18, wherein high voltage is of the same polarity is connected to said control gates for programming said cells.

20. A device according to claim 19, wherein means are connected to said common node for coupling a said common node to reference potential for read, to a high voltage for programming, or to a floating condition for erase.

21. A device according to claim 20, wherein said common line is connected to said high voltage of opposite polarity without connection to a semiconductor substrate containing said memory device.

22. A device according to claim 21 wherein the high voltage connected to the column line for erase is lower than that connected to the selected row line.

* * * * *